(12) United States Patent
AbdEl-Wahid

(10) Patent No.: US 7,237,168 B2
(45) Date of Patent: Jun. 26, 2007

(54) DESIGN FOR TEST OF ANALOG MODULE SYSTEMS

(76) Inventor: Mohammed Ali AbdEl-Halim AbdEl-Wahid, 44 Mohammed El-Khalafawi St., Shoubra Cairo (EG) 11241

( * ) Notice: Subject to any disclaimer, the term of this patent is extended or adjusted under 35 U.S.C. 154(b) by 14 days.

(21) Appl. No.: 11/231,562

(22) Filed: Sep. 20, 2005

(65) Prior Publication Data

US 2006/0090113 A1 Apr. 27, 2006

Related U.S. Application Data

(63) Continuation of application No. 10/039,934, filed on Oct. 26, 2001, now Pat. No. 6,959,409.

(51) Int. Cl.
*G06F 11/00* (2006.01)
(52) U.S. Cl. .................. 714/740; 714/30; 714/733; 324/607; 341/120
(58) Field of Classification Search .................. None
See application file for complete search history.

(56) References Cited

U.S. PATENT DOCUMENTS

| | | | |
|---|---|---|---|
| 4,503,537 A | 3/1985 | McAnney |
| 5,414,365 A | 5/1995 | Coggins et al. |
| 5,481,471 A | 1/1996 | Naglestad et al. |
| 5,568,493 A | 10/1996 | Morris |
| 5,577,052 A | 11/1996 | Morris |
| 5,659,312 A | 8/1997 | Sunter et al. |
| 6,005,407 A | 12/1999 | Arabi et al. |
| 6,202,183 B1 | 3/2001 | Ginetti et al. |
| 6,532,561 B1 | 3/2003 | Turnquist et al. |
| 6,536,006 B1 | 3/2003 | Sugamori |
| 6,560,734 B1 | 5/2003 | Whetsel |
| 6,687,868 B1 | 2/2004 | Furukawa et al. |

OTHER PUBLICATIONS

Fluence Technology Inc., "BISTMaxx™ Product Catalog," 38 p. (Sep. 2000).
Texas Instruments, "IEEE Std 1149.1 (JTAG) Testability Primer," 146 p. (1997).
LogicVision, "LogicVision—PLL BIST," 1 p. (downloaded from http://www.logicvision.com/products/pll.html on Apr. 10, 2001).

(Continued)

*Primary Examiner*—Guy Lamarre
*Assistant Examiner*—John P. Trimmings
(74) *Attorney, Agent, or Firm*—Klarquist Sparkman, LLP

(57) ABSTRACT

An apparatus for testing an integrated circuit that includes analog nodes is disclosed. In one aspect, an integrated circuit comprises testing circuitry and core logic circuitry. A memory in the testing circuitry stores data identifying analog nodes in the core logic circuitry and tolerance values associated with the analog nodes. A condition checker compares actual test values with the associated tolerance values. A main control unit controls the testing circuitry and synchronizes testing of the core logic circuitry. In another aspect, the testing circuitry includes a host computer interface useful for communicating with a host computer. A data memory in the testing circuitry is used for storing diagnostic data. The contents of the data memory may then be uploaded to a host computer. Test stimuli may be transmitted to the integrated circuit from a location outside the integrated circuit to perform testing.

18 Claims, 14 Drawing Sheets

OTHER PUBLICATIONS

Chatterjee and Nagi, "Design for Testability and Built-In Self-Test of Mixed-Signal Circuits: A Tutorial," *IEEE 10th Int'l Conference on VLSI Design*, pp. 388-392.

Wey, "Mixed-Signal Circuit Testing—A Review," *Third Int'l Conference on Electronics, Circuits and Systems*, pp. 1064-1067 (1996).

Lin et al., "Automatic BIST Design Tool for Mixed-Signal Circuits," *AUTOTESTCON '98: IEEE Systems Readiness Technology Conference*, 97-102 (1998).

Lubaszewski et al., "Design of Self-Checking Fully Differential Circuits and Boards," *IEEE Transactions on VLSI Systems*, vol. 8, No. 2, pp. 113-128 (Apr. 2000).

"IEEE Standard for a Mixed-Signal Test Bus," *IEEE Std. 1149.4*, 84 pp. (2000).

"IEEE Standard Test Access Port and Boundary-Scan Architecture," *IEEE Std. 1149.1-1a*, 172 pp. (1993).

Nicolaidis & Zorian, "Scaling Deeper to Submicron: On-Line Testing to the Rescue," *IEEE Proceedings of the Design, Automation and Test in Europe Conference and Exhibition*, 1 p. (1999).

Milor, "A Tutorial Introduction to Research on Analog and Mixed-Signal Circuit Testing," *IEEE Transactions on Circuits and Systems—II: Analog and Digital Signal Processing*, vol. 45, No. 10, pp. 1389-1407 (Oct. 1998).

FIG. 6a

| STATE | | CONTROL | | | | | | | OUTPUT |
|---|---|---|---|---|---|---|---|---|---|
| | | RDY | XmtTypSMc | CU_EXIT1 | BitCntsEqOne | Pause | UpdateSft | ClkCntr2Rst | TMS |
| StartUnknown_STAT | | X | X | X | X | X | X | X | 1 |
| TestLogicReset_STAT | | X | X | X | X | X | X | X | 0 |
| RunTestIdle_STAT | | 1 | X | X | X | X | X | X | 0 |
| RunTestIdle_STAT | | 0 | X | X | X | X | X | X | 1 |
| SelectDRScan_STAT | | X | 1 | X | X | X | X | X | 1 |
| SelectDRScan_STAT | | X | 0 | X | X | X | X | X | 0 |
| SelectIRScan_STAT | | X | X | X | X | X | X | X | 0 |
| Capture_STAT | | X | X | X | X | X | X | X | 0 |
| Shift_STAT | | X | X | 1 | X | X | X | X | 1 |
| Shift_STAT | | X | X | X | 1 | X | X | X | 1 |
| Shift_STAT | | X | X | 0 | 0 | X | X | X | 0 |
| Exit1_STAT | | X | X | X | X | 0 | X | X | 1 |
| Exit1_STAT | | X | X | X | X | 1 | X | X | 0 |
| Pause_STAT | | X | X | X | X | 0 | X | X | 1 |
| Pause_STAT | | X | X | X | X | 1 | X | X | 0 |
| Exit2_STAT | | X | X | X | X | X | 1 | X | 1 |
| Exit2_STAT | | X | X | X | X | X | 0 | X | 0 |
| Update_STAT | | 0 | X | X | X | X | X | X | 1 |
| Update_STAT | | 1 | X | X | X | X | X | X | 0 |

DESIGN FOR TEST OF ANALOG MODULE SYSTEMS

CROSS REFERENCE TO RELATED APPLICATIONS

This application is a continuation of U.S. patent application Ser. No. 10/039,934 filed Oct. 26, 2001, now U.S. Pat. No. 6,959,409, entitled, "DESIGN FOR TEST OF ANALOG MODULE SYSTEMS," which is incorporated herein by reference.

FIELD

This invention relates generally to the testing of integrated circuits, and, more particularly, to on-line and off-line testing of analog and mixed-signal integrated circuits.

BACKGROUND

As integrated circuits are produced with greater and greater levels of circuit density, efficient testing schemes that guarantee very high fault coverage while minimizing test costs and chip area overhead have become essential. Integrated circuits are presently tested using a number of structured design for testability (DFT) techniques. These techniques rest on the general concept of making all or some state variables (memory elements such as flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers, as shown in U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test (CUT) works properly.

For ICs containing only digital components, testing can be a fairly straightforward process using the techniques described above. Testing of analog circuitry, on the other hand, poses special challenges. Analog testing carries greater uncertainty and variability of results when compared with digital testing because of the fundamental differences between analog and digital components. While detecting a faulty digital circuit can be as simple as detecting the difference between 0 and 1, analog components, or nodes, in functioning circuits have a continuous range of acceptable values, with an infinite number of values possible within the limits of the range.

Furthermore, modern integrated circuits have become so densely packed with logic that traditional testing methods no longer suffice. Using external automated testing equipment (ATE) to input test data and to read back and analyze test output is becoming prohibitively expensive in terms of time, pin overhead (additional pins needed for input and output of test data) and overall cost. Furthermore, the traditional "bed of nails" approach to testing analog circuits is no longer workable because the layout of modern integrated circuits restricts direct physical access to the analog nodes from outside the chip.

Previously developed methods of analog or mixed signal testing have been unsatisfactory for today's system on a chip (SoC) applications. In some methods, the analog or mixed signal circuitry is divided into functional blocks, with each block containing additional or modified circuitry to turn the block into an oscillator, which then indicates whether the block is functioning correctly. However, such methods have the drawback of requiring modification of each block under test, therefore incurring high additional overhead in terms of design time and chip area. Other methods have been proposed in which checker circuits are added to each individual analog node to test the functionality of the node. But again, high overhead cost makes such methods undesirable, especially in systems with large number of analog components. Moreover, the testing methods described above are unable to accurately detect a full range of fault types. While some methods are able to detect permanent faults and some parametric faults, other parametric faults and most intermittent faults can not be successfully exposed.

Thus, while integrated circuit designs incorporate ever-increasing numbers of analog nodes, the development of efficient testing methodology continues to lag behind. Minimizing chip area and design-time overhead while maximizing the accuracy and completeness of testing are of critical importance.

SUMMARY

An apparatus for testing an integrated circuit that includes analog nodes is disclosed.

In one aspect, an integrated circuit comprises testing circuitry and core logic circuitry. Data is stored identifying analog nodes in the core logic circuitry and tolerance values associated with the analog nodes. A condition checker compares actual test values with the associated tolerance values. A main control unit controls the testing circuitry and synchronizes testing of the core logic circuitry.

In another aspect, the testing circuitry includes a host computer interface useful for communicating with a host computer. A data memory is used for storing diagnostic data. The contents of the data memory may then be uploaded to a host computer. Test stimuli may be transmitted to the integrated circuit from a location outside the integrated circuit to perform testing. Memory for storing data may be memory in the testing circuitry or on-chip memory.

In yet another aspect, the test controller module is JTAG-compliant. The test controller module comprises a memory for storing data transmitted to the test controller module, a control unit, and a test access port controller. Additional test controller modules are added to increase testing throughput.

In another aspect, the condition checker comprises a means for receiving the test values from the analog nodes, a means for receiving the associated tolerance values, and a means for checking whether the test values are within the associated tolerance values. Noise calibration circuitry can be added to the condition checker. One or more additional condition checkers can be added to increase testing throughput.

These features and others of the described embodiments will be more readily apparent from the following detailed description which proceeds with reference to the accompanying drawings.

BRIEF DESCRIPTION OF THE FIGURES

FIG. 6A is a state table showing the TAP controller states.

FIG. 7A is a state table showing the JG_CU states.

FIG. 10A is a state table showing the main control unit states.

DETAILED DESCRIPTION

Overview

Figure 1:
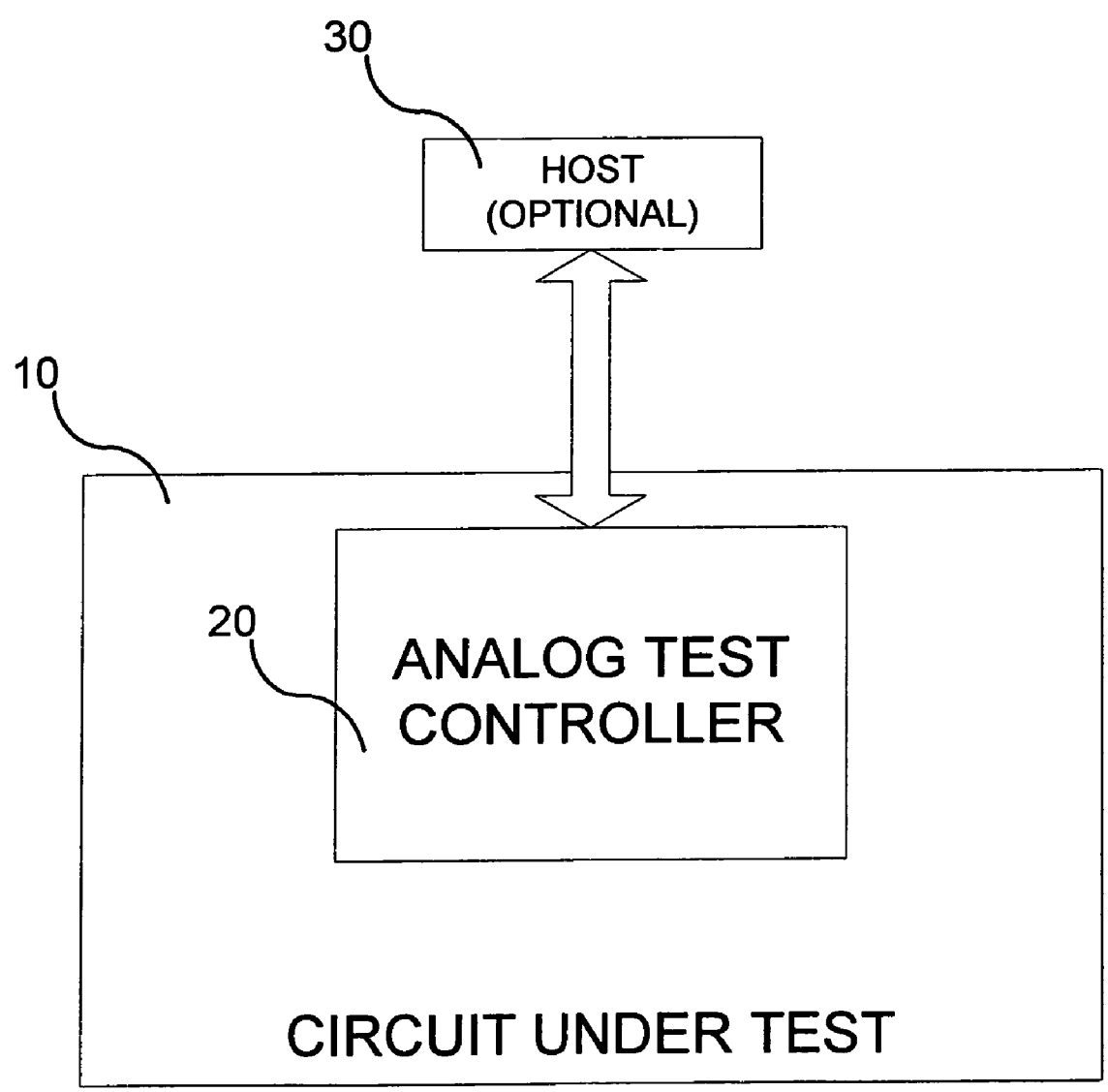
FIG. 1 is a block diagram of the system for testing analog module systems.

Referring to FIG. 1, an analog test controller (ATC) 20 is used to test analog or mixed-signal modules in a circuit under test (CUT) 10. The logic of the analog test controller is integrated with the logic of the CUT. The ATC may contain all information needed for performing testing on the CUT, or it may download the information necessary from an external host 30, and upload test results to the external host. Thus, the ATC is capable of performing either on-line (all testing performed on-chip) or off-line (using an external host) testing.

Figure 2:
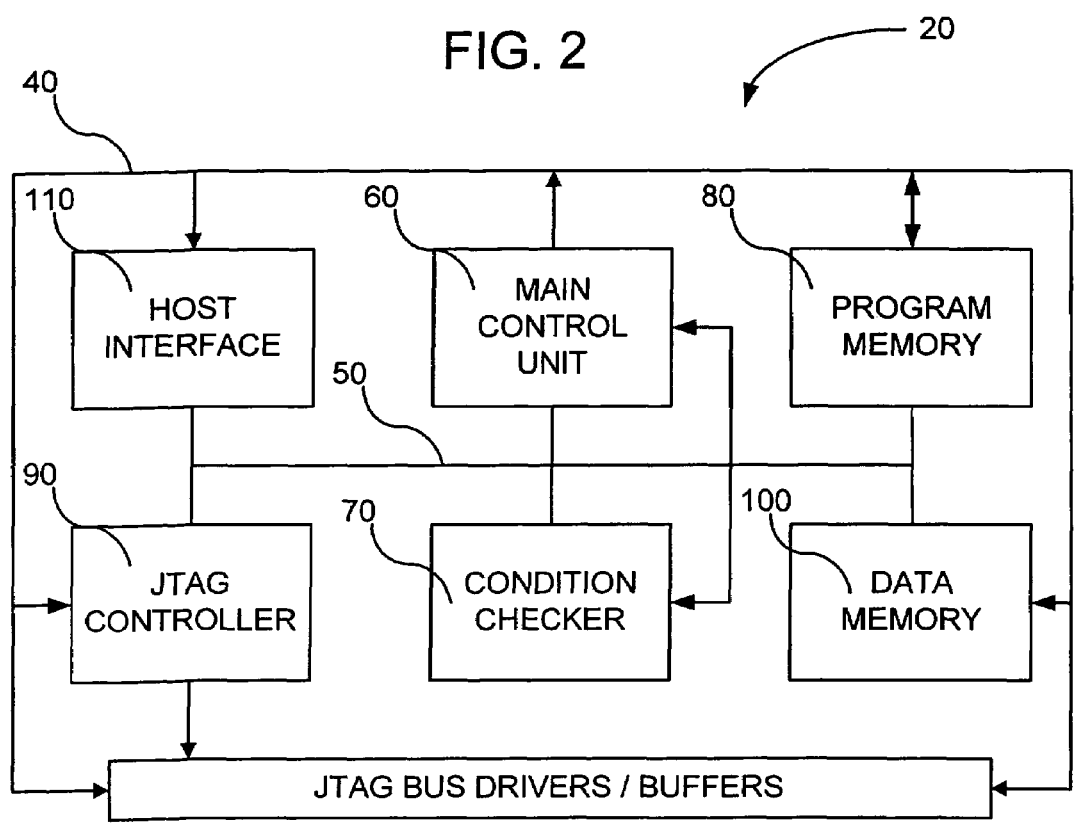
FIG. 2 is a block diagram of an analog test controller according to the invention.

FIG. 2 shows one embodiment wherein the ATC 20 includes components connected to a control bus 40 and a data bus 50. A main control unit 60 (MCU) is coupled to a condition checker 70, a program memory 80, and a JTAG controller 90. The MCU 60 is operable to control the other components in the ATC. The interrelationship between these components is further described below.

Figure 3:
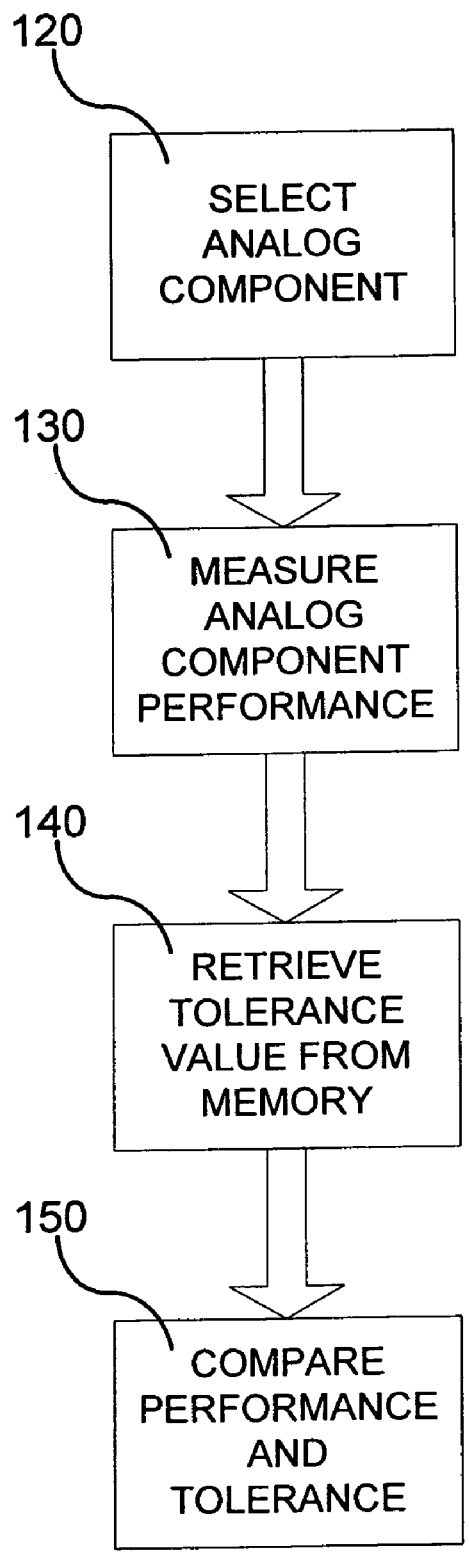
FIG. 3 is a flowchart of a method for testing analog modules.

Referring to FIG. 3, a method of using a working embodiment includes selecting an analog node in the CUT to be tested (process block 120), measuring the performance of the selected analog component (process block 130), retrieving a tolerance value from the program memory 80 (process block 140), and using the condition checker 70 to compare the performance of the analog node with the associated tolerance value (process block 150). The program memory may be a read-only memory, a programmable read-only memory, a random access memory, or any other suitable type of memory.

In some embodiments, the ATC may also include a host interface 110. The host interface allows the ATC to download information relating to the testing of the analog nodes from an external host computer, as shown in FIG. 1. In other embodiments, the ATC may also include a data memory 100. The data memory allows the ATC and CUT to operate in diagnostic mode, collecting specific information regarding the performance of individual analog nodes. The data memory may be a random access memory or any other suitable type of memory.

Condition Checker

Figure 4:
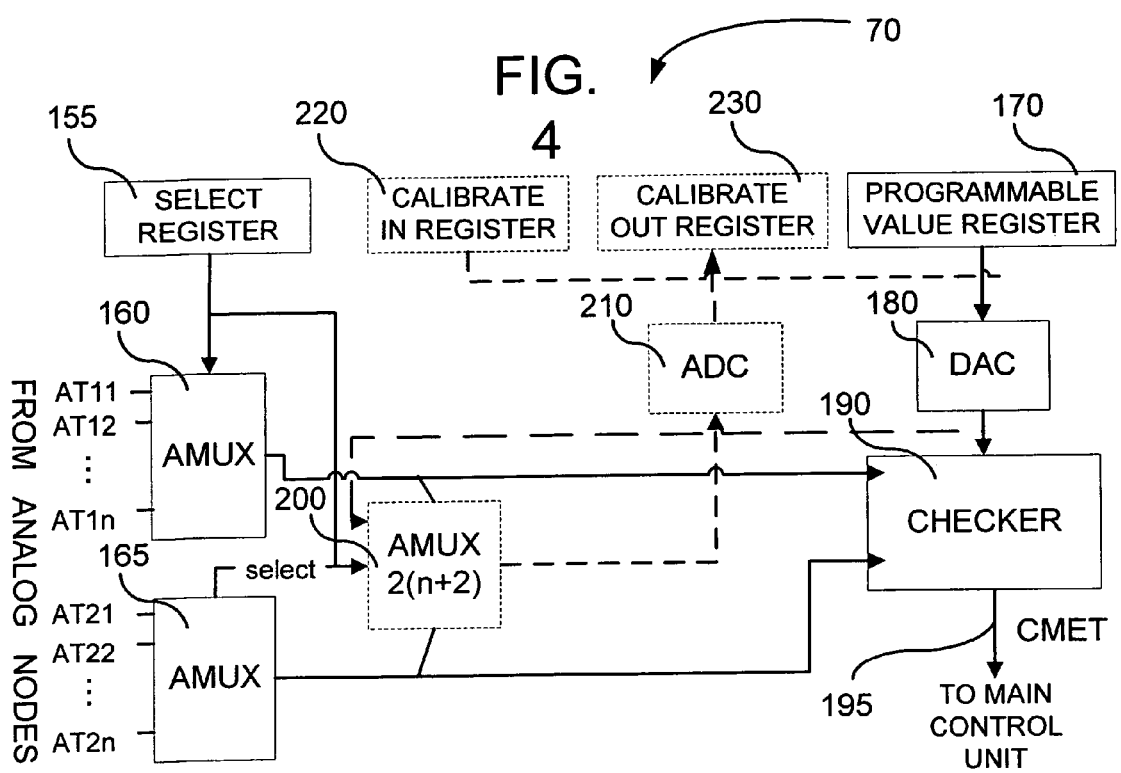
FIG. 4 shows a more detailed block diagram of circuitry working with a condition checker.

FIG. 4 illustrates a working embodiment of a condition checker 70 in an ATC. The condition checker in the ATC compares values supplied from the main control unit 60 and compares such values to test values from a particular analog node being tested. The illustrated condition checker includes a select register 155, analog multiplexers 160 and 165, a programmable value register 170, a digital-to-analog converter 180, and a checker 190. Other condition checker designs may also be used as well-understood by those skilled in the art.

Test values in the form of analog signals from the analog nodes in the CUT are transmitted from the CUT along analog buses AT1 and AT2. Lines from the AT1 and AT2 buses are fed into analog multiplexers 160 and 165, respectively. Select register 155 is controlled by the MCU 60 and determines which analog signal will be checked. The selected analog signal is then fed into checker 190, where it is compared with a tolerance value. The tolerance value originates in the program memory. The instructions and data stored in the program memory, and the processing of those instructions and data, are detailed in the discussion of the MCU 60.

From the program memory, the tolerance value is input to programmable value register 170, processed into an analog signal by digital-to-analog converter 180, and compared with the test value analog signal from the analog multiplexers in analog checker 190. If the test value falls within the tolerance value, the analog node is functioning normally, and the CMET signal 195 produced by the analog checker 190 is set to "0." If the test value falls outside the tolerance value, the analog node is in a fault state, and CMET is set to "1." The CMET signal is returned to the MCU.

In some embodiments, additional components may be added to the condition checker to accommodate cases where a test value of an analog node must be calibrated to account for noise or distortion, such as where noise on a line would, without calibration, consistently return an erroneous CMET value. In this embodiment, an additional analog multiplexer 200, an analog-to-digital converter 210, a calibrate-in register 220, and a calibrate-out register 230 can be added to the condition checker. The calibrate-in register 220 produces a calibration value that is added to the tolerance value produced from the programmable value register 170. The combined value is processed by the digital-to-analog converter and fed into the analog multiplexer 200, along with signals from analog multiplexers 160 and 165. From the analog multiplexer 200, the calibrated signal is sent to the analog-to-digital converter 210, and the resulting digital information is sent to the calibration-out register 230, which is then output to the MCU.

In other embodiments, the analog checker 190 may be replaced with a digital checker. In such embodiments, one or more analog-to-digital converters are added to convert signals from analog multiplexers 160 and 165 into a digital representation. Digital-to-analog converter 180 is omitted in embodiments with a digital checker. From the program memory, a tolerance value is input to programmable value register 170 and compared with a digitally represented test value from an analog node in the digital checker. As explained above, if the test value falls within the tolerance value, the analog node is functioning normally, and the CMET signal 195 produced by the analog checker 190 is set to "0"; otherwise, the analog node is in a fault state, and CMET is set to "1." As in embodiments with an analog checker, the CMET signal is returned to the MCU for analysis.

A plurality of condition checkers may also be used in the ATC. Additional checkers allow additional testing throughput to enhance testability. As explained below, in embodiments with a plurality of condition checkers, the MCU can be modified to select which condition checker will be used to perform a particular comparison.

JTAG Controller

1. Overview

In a working embodiment, a JTAG controller 90 prompts particular analog nodes in the CUT to provide test values to the condition checker. Although a single JTAG controller is used in a working embodiment, a plurality of JTAG controllers may be used to increase testing throughput. The JTAG controller in the working embodiment complies with the IEEE JTAG standards 1149.1 and 1149.4.

Figure 5:
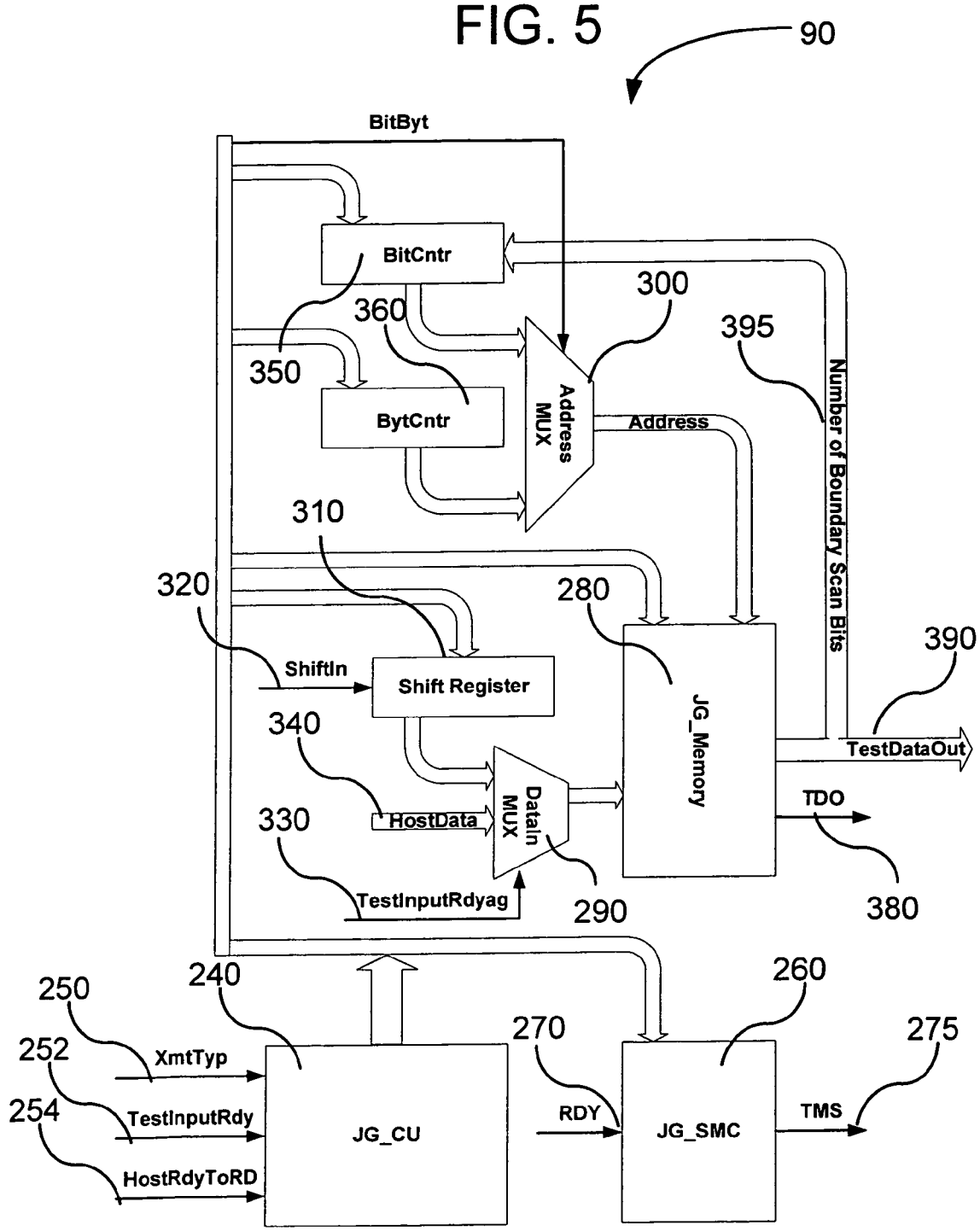
FIG. 5 is a block diagram of the JTAG controller.

The components of the JTAG controller in a working embodiment are illustrated in FIG. 5. Their functions are described below in a discussion of a typical operation of the module, as controlled by controllers JG_CU 240 and JG_SMC 260.

2. JG_CU Controller

Figure 7:
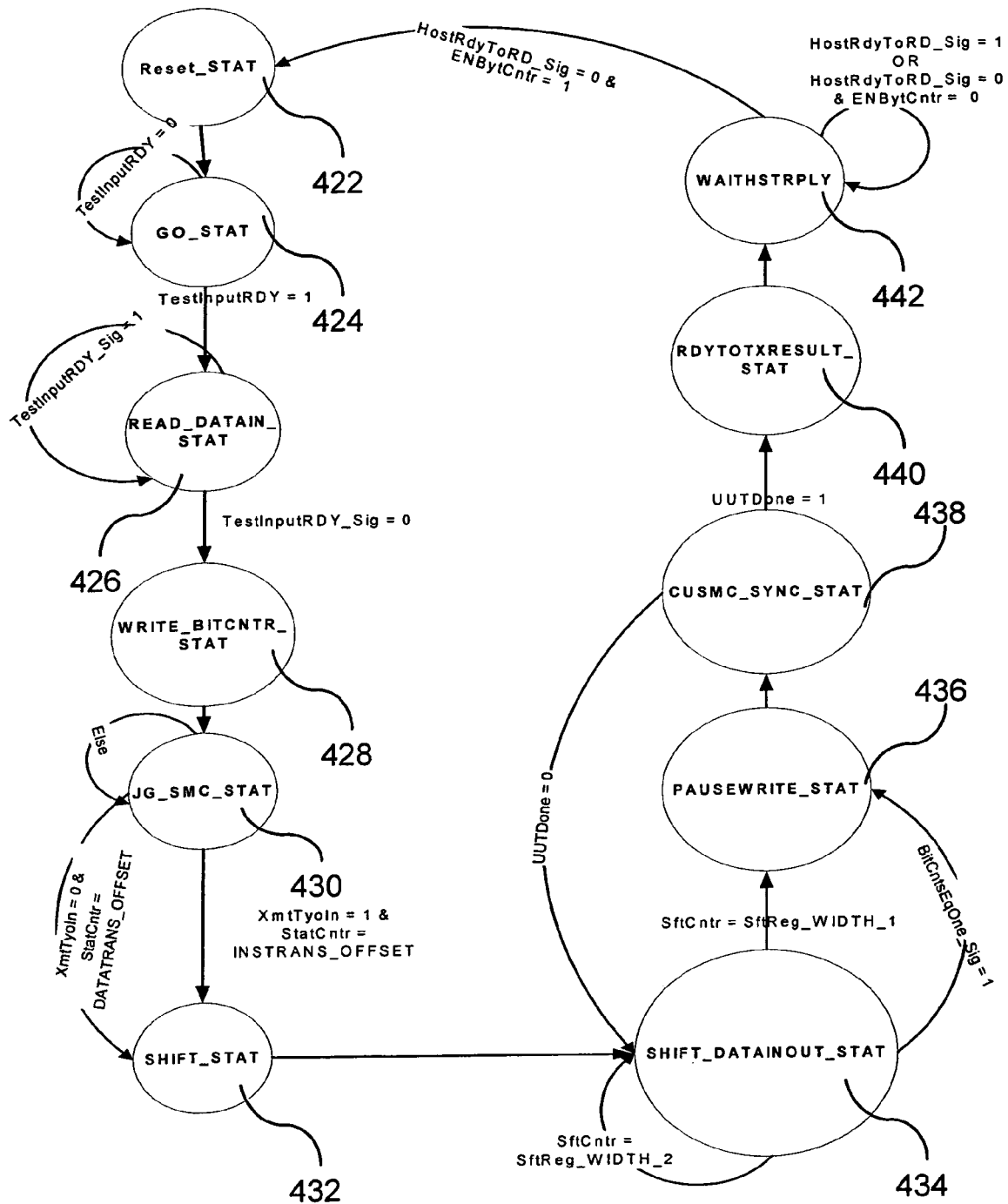
FIG. 7 is a state machine block diagram of a JG_CU module.
Figure 7A:
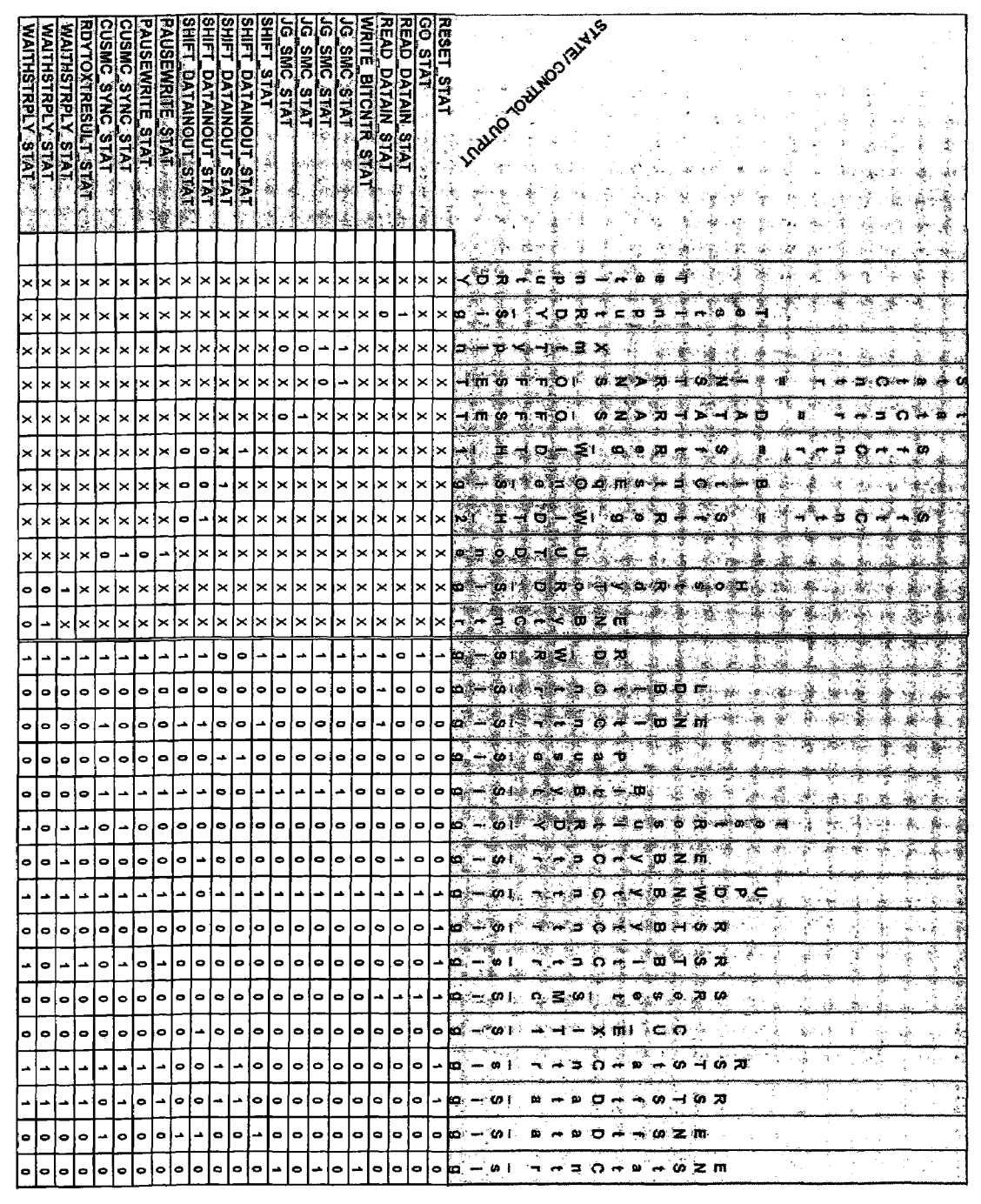

Referring to FIG. 5, the components of the JTAG controller 90 are controlled by a state machine in the JG_CU controller 240. JG_CU 240 receives inputs 250, 252, and 254 from the MCU. The JG_CU 240 then produces signals used to control the other components of the JTAG controller. The JG_CU state machine 240 is illustrated in FIG. 7. The states, control signals, and output signals associated with JG_CU are illustrated in FIG. 7A.

First, JG_CU is reset to a known state (i.e., all zeroes) in Reset_STAT 422. JG_CU then enters GO_STAT 424. JG_CU remains in GO_STAT until the MCU indicates it is ready to send data via signals (252, 330) to the JTAG controller. At that time, JG_CU enters READ_DATAIN_STAT 426. In this state, bytes of data (340) from the program memory are sent by the MCU and loaded into JG memory 280 via DataIn multiplexer 290.

Figure 8:
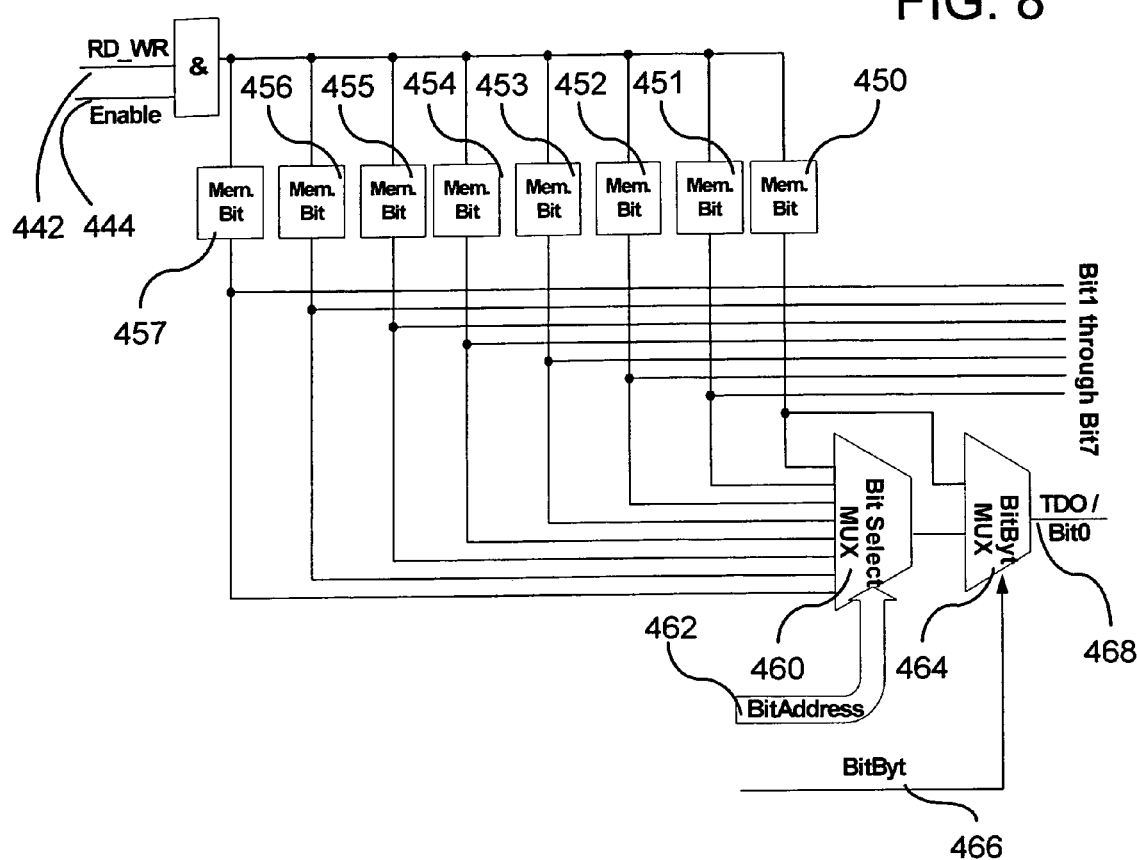
FIG. 8 is a detailed hardware diagram of a memory cell.

The JG memory consists of up to eight bytes of memory. Each register consists of the components illustrated in FIG. 8. Control signals 442 and 444 activate the register and determine whether the JTAG controller is writing to or reading from the register. Memory bits 450–457 hold single bits, memory bit 450 being the least significant bit (LSB). Bit select multiplexer 460, bit address selector 462, BitByt multiplexer 464, and BitByt selector 466 are used to select a particular bit for output, or to send an entire byte for output, depending on whether bits or bytes are to be shifted out. TDO/Bit 0 output 468 along with the outputs for the other bits are then sent to an ordinary memory multiplexer for output.

Byte counter 360 addresses the JG memory via address multiplexer 300 for writing the incoming bytes. The last byte loaded contains the total number of boundary scan bits shifted into the JG memory. Bit counter 350 is loaded with the number of bits (395) to be shifted out to the CUT in WRITE_BITCNTR_STAT 428.

Once the bit counter has been loaded, JG_CU proceeds to JG_SMC_STAT 430. In this state, the JG_SMC state machine is reset and given a control signal which denotes transmit type (data or instruction). JG_CU then waits for a fixed number of clock cycles before making the transmittal. JG_CU then enters SHIFT_STAT 432, where it pauses for one clock cycle to synchronize JG_SMC and JG_CU.

Bits are shifted in from the CUT and out to the CUT via TDO line 380 in SHIFT_DATAINOUT_STAT 434. Up to 8 bytes (256 bits) may be shifted in and out depending on the implementation of the CUT core. Bits shifted out to the CUT are addressed by the bit counter 350 via address multiplexer 300. For each bit shifted out to the CUT, one bit is shifted in (320) from the CUT to the shift register 310, as illustrated in FIG. 5.

Referring again to FIG. 7, JG_CU enters PAUSEWRITE_STAT 436 when the shift register is filled, or when the bit counter indicates that all bits have been shifted. No bits are shifted in to the shift register in this state, and the bits in the shift register 320 are written to the JG memory. JG_CU now enters CUSMC_SYNC_STAT 438. If there are still bits to be shifted, JG_CU returns to SHIFT_DATAINOUT_STAT 434, and the shifting process continues.

In diagnostic mode, the bits shifted in to the shift register are used to indicate the most recent state of the CUT. In such a case, the shifted-in bits are later transmitted (390) to the data memory. However, when not in diagnostic mode, the shifted-in bits are not used.

When all bits have been shifted, JG_CU enters RDYTOTXRESULT_STAT 440. The result of the test is now ready to be transmitted to the MCU. JG_CU enters the WAITHSTRPLY state 442, and remains there until the HostRdyToRD_Sig signal is high, or the signal is low and the byte counter 360 is zero. Otherwise, JG_CU returns to Reset_STAT 422.

3. JG_SMC (TAP) Controller

Referring again to FIG. 5, the JTAG controller also contains a TAP (test access port) controller containing a state machine, JG_SMC 260. JG_SMC emulates state machines in the nodes to be tested, and allows the ATC to communicate with those nodes. JG_SMC takes input signal RDY 270 from the MCU and produces output signal TMS (test mode select) 275. FIG. 6a illustrates the states, control signals, and output signal associated with JG_SMC.

Figure 6:
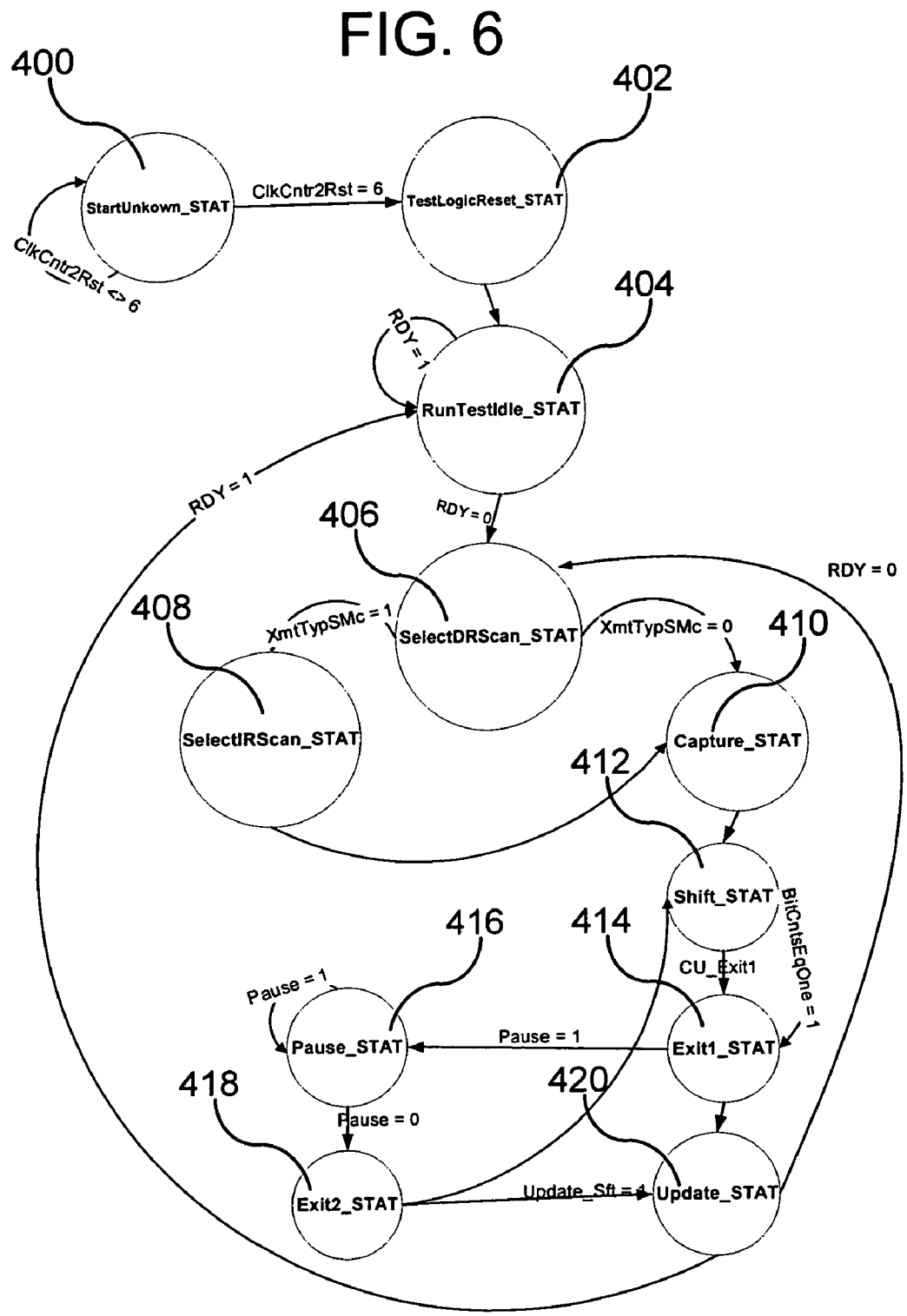
FIG. 6 is a state machine block diagram of a TAP controller.

The state machine for JG_SMC is based on a similar state machine in IEEE standard 1149.1, and is illustrated in FIG. 6. The states, control signals, and output signals associated with JG_SMC are illustrated in FIG. 6A. Referring to FIG. 6, JG_SMC begins in StartUnknown_STAT 400. On the sixth clock cycle in this state, JG_SMC enters TestLogicReset_STAT 402, and then enters RunTestIdle_STAT 404. JG_SMC remains in the state while the signal RDY (270) from the MCU is high. When RDY is low, JG_SMC enters SelectDRScan_STAT 406. In this state, JG_SMC receives the signal from JG_CU indicating transmittal type (instruction or data). If the transmittal type is instruction, JG_SMC enters SelectIRScan_STAT 408 before proceeding to Capture_STAT 410. If the transmittal type is data, JG_SMC enters Capture_STAT 410 without entering SelectIRScan_STAT 408.

JG_SMC then enters Shift_STAT 412. Following the shift state, JG_SMC enters Exit1_STAT 414. If shifting is complete, JG_SMC enters Update_STAT 420, and then returns to RunTestIdle_STAT 404 if RDY is high, or to SelectDRScan_STAT 406 if RDY is low. If shifting needs to be paused, JG_SMC enters Pause_STAT 416, and when the pause is completed, enters Exit2_STAT 418. From this state, if shifting must be resumed, JG_SMC returns to Shift_STAT 412. If shifting is complete, JG_SMC goes to Update_STAT 420 and returns to RunTestIdle_STAT 404 if RDY is high, or to SelectDRScan_STAT 406 if RDY is low.

Main Control Unit (MCU)

1. Overview

Figure 9:
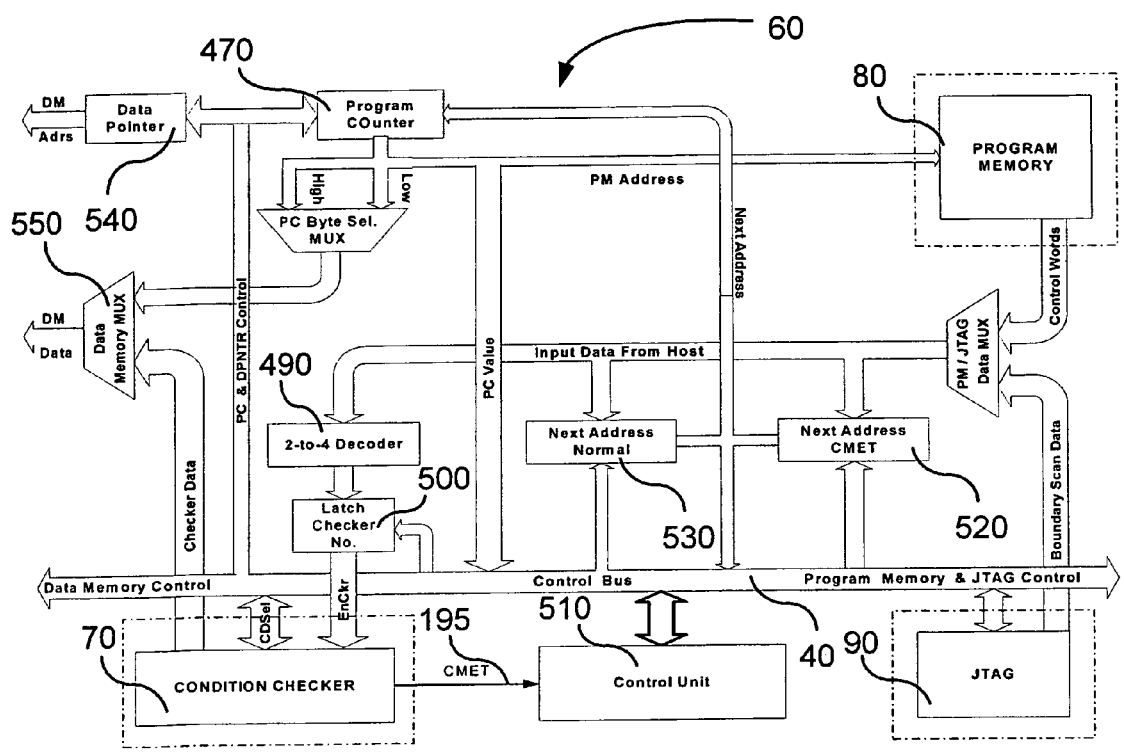
FIG. 9 is a detailed block diagram of the main control unit.

FIG. 9 illustrates a working embodiment of the MCU. These components include program counter 470 (which addresses program memory 80 for reading of control words), control unit 510 containing a large state machine, NxtAdrsCMET register 520, and NxtAdrsNormal register 530.

FIG. 9 also illustrates additional components which may be used in other embodiments. For example, in some embodiments, data pointer 540 and data memory multiplexer 550 may be added for collection of diagnostic data. In embodiments incorporating more than one condition checker, checker enable decoder 490 and latch 500 may be added to select a checker to perform a checking operation.

2. MCU Operation

Figure 10:
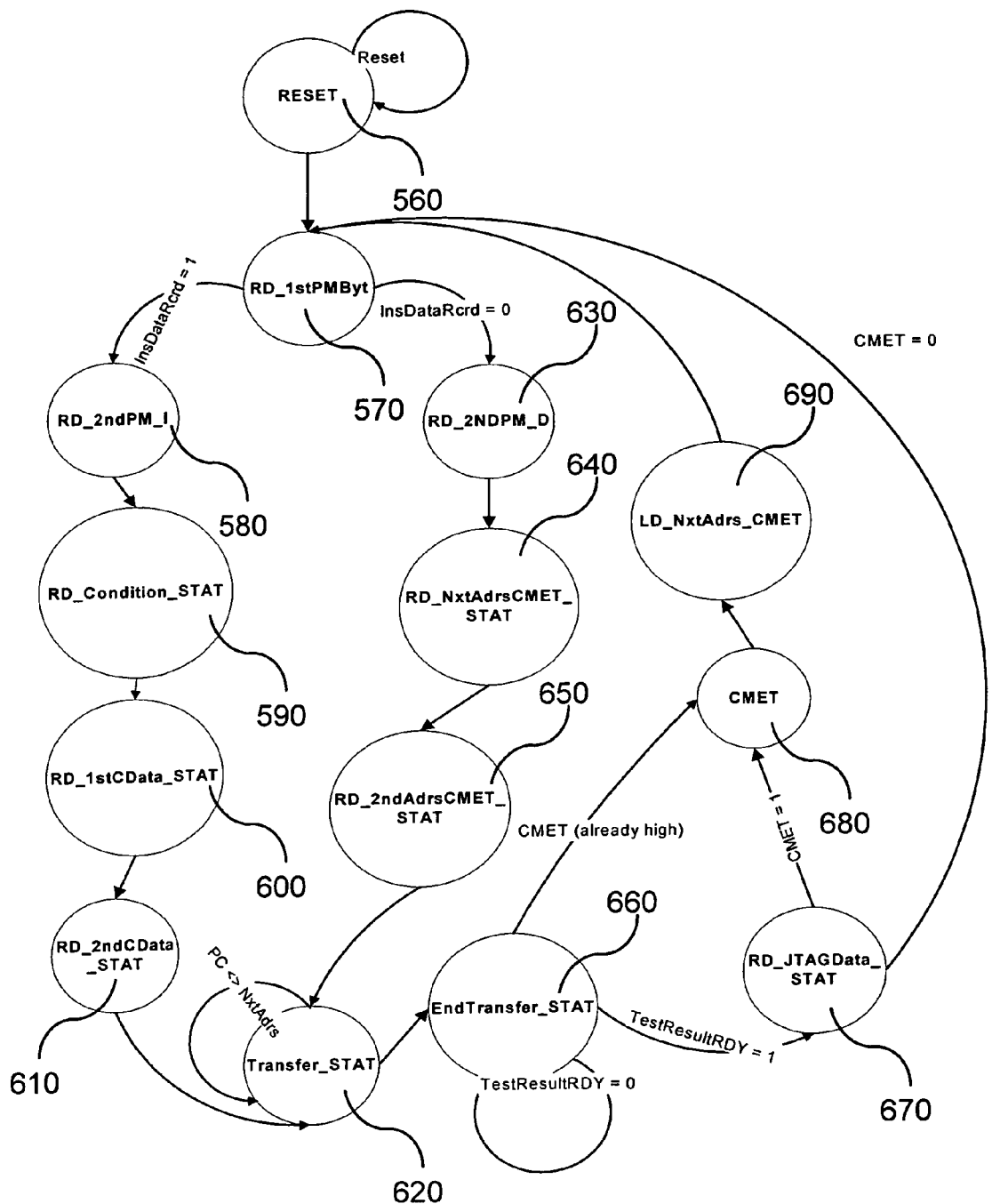
FIG. 10 is a state diagram of the main control unit.
Figure 10A:
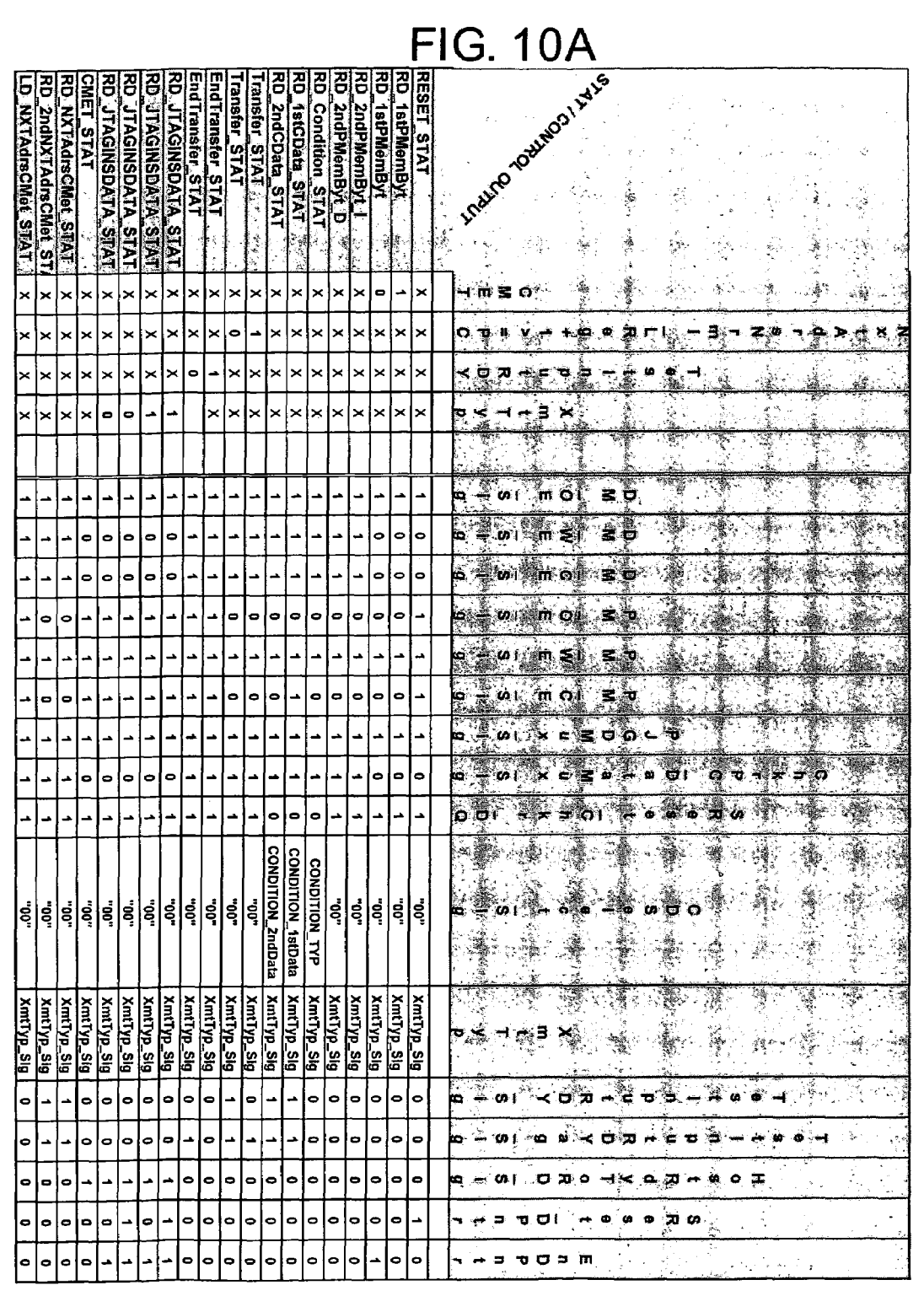

FIG. 10 illustrates the state machine that controls the MCU. The states, control signals, and output signals associated with the MCU state machine are illustrated in FIG. 10A. Referring to FIG. 10, at start up, the MCU is reset to a known state (560). The MCU then enters the RD_1stP-MByt state 570. In this state, the MCU reads the first byte of a control word in program memory. According to the JTAG standard, instructions must be transmitted before data. Therefore, in a working embodiment which complies with the JTAG standard, an instruction record is transmitted first from the program memory. The structure of the instruction records in a working embodiment is shown in Table 1:

TABLE 1

PRELOAD_U/PROBE INSTRUCTION RECORD

| Field Name | Number of bits | Notes |
|---|---|---|
| Next Address Normal | 1 (Data/instruction) + 15 | |
| Condition Type | 8 (3 + 3 + 2) | 3 bits for each condition data 1 and 2, and 2 bits for checker number to be enabled, table 5-2 |
| Condition Data 1 | 8 | Upper limit for the monitored signal node |
| Condition Data 2 | 8 | Lower limit for the monitored signal node |
| Boundary Scan Data | 256 | Contains the data to be downloaded into the CUT |
| Number of Boundary Scan bits | 8 | |

As shown in Table 1, the first bit of the first byte indicates whether the control word is an instruction record or a data record. The remaining bits of the first byte and the second byte make up the address of the analog node to be tested in the CUT (Next Address Normal).

The MCU reads the second byte of Next Address Normal in the RD_2ndPM_I state 580. The MCU then enters RD_Condition_STAT 590. In this state, the MCU reads the byte containing "Condition Type," as shown in Table 1 above. The bits in Condition Type indicate whether a test value in a properly functioning analog component should be equal to, not equal to, greater than, less than, greater than or equal to, or less than or equal to a particular tolerance value. In addition, Condition Type indicates which checker (in a multi-checker embodiment) should perform the checking operation. The composition of the Condition Type field is shown in Table 2:

TABLE 2

CONDITION TYPE FIELD BIT DETAIL

| B0–B2 B3–B5 | Symbol | B6–B7 | Checker |
|---|---|---|---|
| 000 | = | 00 | CKR00 |
| 001 | ≠ | 01 | CKR01 |
| 010 | > | 10 | CKR02 |
| 011 | < | 11 | CKR03 |
| 100 | ≧ | | |
| 101 | ≦ | | |

After reading Condition Type, the MCU passes through RD_1stCData_STAT 600 and RD_2ndCData_STAT 610. In these states, the MCU reads the first and second Condition Data bytes, as shown in Table 1. The Condition Data values correspond with the first and second comparison types in bits 0–2 and bits 3–5 of the Condition Type field. At this point, the MCU has read the information necessary for the condition checker to perform a comparison of a test value from an analog node in the CUT with tolerance values in the program memory.

The MCU now enters Transfer_STAT 620. In this state, the MCU transfers the Boundary Scan Data and the number of boundary scan bits (see Table 1 above) to the JTAG controller, and transfers the Condition Type and Condition Data bytes to the condition checker. Transferring continues until the program counter reaches the next address in the program memory.

As explained above, the JTAG controller reads the incoming data into the JG memory, sends the boundary scan data to the analog node at Next Address Normal via the TDO output, and prompts the node to produce a test value. The condition checker receives the analog node's test value via the analog buses, downloads the tolerance values (in the form of the Condition Type and Condition Data bytes) to the programmable value register, and performs the comparison. After the comparison, the signal CMET is high ("1") if the node was faulty (outside the tolerance value) and low ("0") if the node is functioning normally (within the tolerance value).

The MCU now enters EndTransfer_STAT 660. The MCU remains in this state until the JTAG controller indicates (via the TestResultRDY signal) that the results of the test are ready to be transmitted. At that point, the MCU enters RD_JTAGData_STAT 670. In an embodiment where diagnosis is desired, boundary scan data from the node under test is written to the data memory. A structure for records saved in data memory is shown in Table 3:

TABLE 3

SAVED RECORD IN DATA MEMORY

| Field Name | Number of bits | Notes |
|---|---|---|
| Next Address (normal) | 16 | Always at address 00 saves the address of the pin at which the condition is met |
| Digital equivalent Analog value. | 16 | |

At this point, the CMET signal has not yet been received by the MCU because, in order to comply with the JTAG standard, a data record must first be read from the program memory. Therefore, after the instruction record has been processed, the MCU returns to the RD_1stPMByt state and a data record is read in states 630, 640, and 650. A structure for the data records in a working embodiment is shown in Table 4:

TABLE 4

PRELOAD_U/PROBE DATA RECORD

| Field Name | Number of bits |
|---|---|
| Next Address Normal | 16 |
| Next Address CMET | 16 |
| Boundary Scan Data | 255 |
| Number of Boundary Scan bits | 8 |

Once the data record has been read and transferred, CMET can be monitored.

If the condition checker found the node to be operating normally (CMET=0), the MCU returns directly to the RD_1stPMByt state 570 to begin reading at Next Address Normal in the program memory.

If the condition checker found the node to be faulty (CMET=1), the MCU enters the CMET state 680 for synchronization. From the CMET state, the MCU then enters the LD_NxtAdrs_CMET state 690. In this state, referring to FIG. 9, the program counter 470 is loaded with the address of Next Address CMET, which is the address of the next node that is dependent on the node found to be in a fault condition. The MCU then returns to the RD_1stPMByt state 570 in FIG. 10, and begins reading from the address in the program counter.

Once the first full instruction record/data record cycle has been completed, and the next node's instruction record has been read and transferred, a new way of exiting EndTransfer_STAT 660 arises. In a case where CMET is already high (i.e., the previous node was found to be faulty), the MCU enters CMET state 680 directly from EndTransfer_STAT 660. This operation continues until either the data memory is full or the system under test is halted.

ADDITIONAL CONSIDERATIONS

Figure 11:
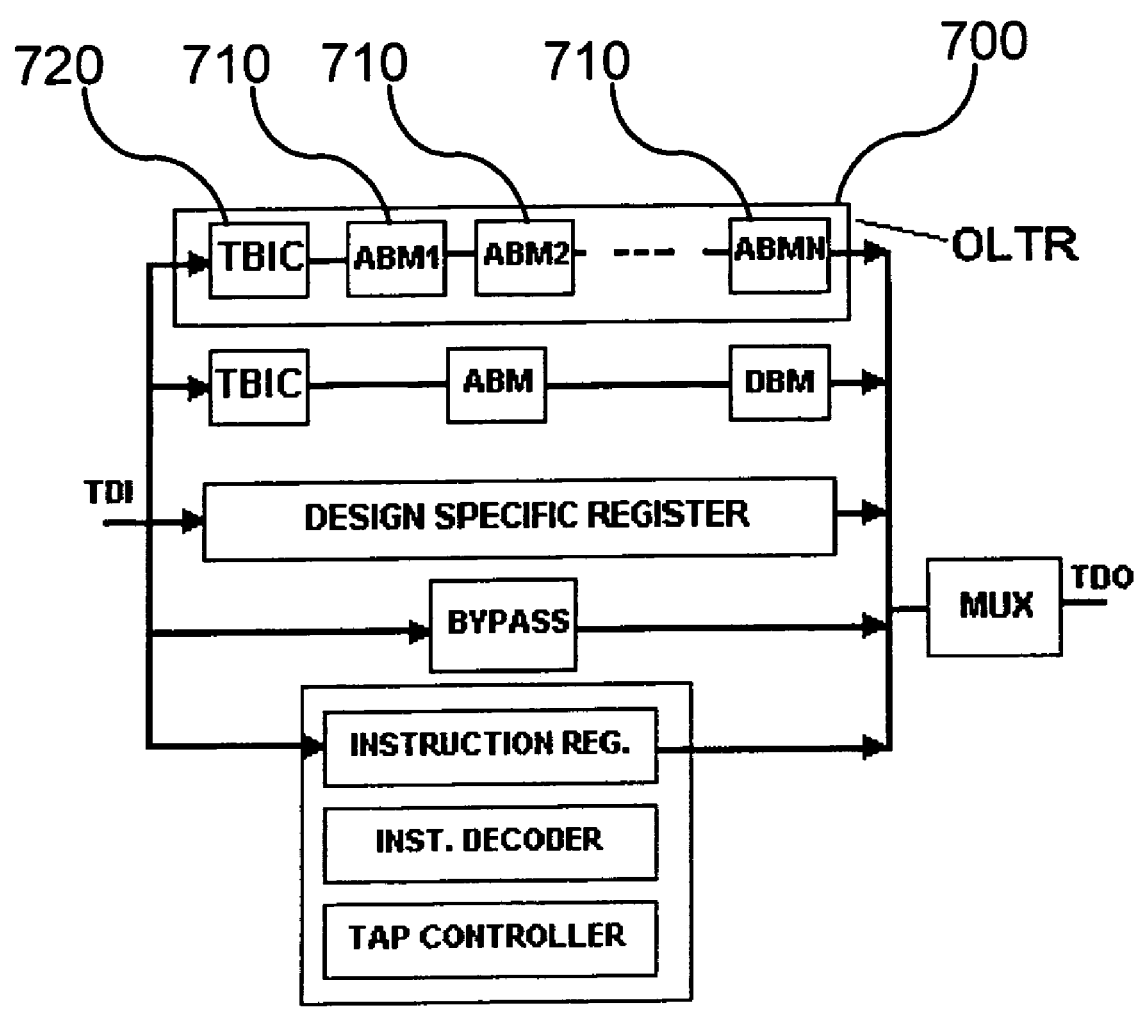
FIG. 11 is a block diagram of an internal chip boundary scan architecture.

Referring to FIG. 11, in order to enhance the on-line testing of a system using IEEE JTAG standard 1149.4, a data register, such as an on-line test register 700 (OLTR), may be added to internal chip boundary scan registers as the standard permits. An OLTR contains the analog boundary modules 710 (ABMs) required to cover the nodes of interest. A specific instruction to preload the OLTR can be added: PRELOAD_U. This instruction should load the specific ABMs, set the control latches of the test bus interface circuit 720 (TBIC) to the ABn bus, set the ATn control latches to connect the external bus ATn to ABn, and select one or more nodes to be monitored. An ordinary PROBE instruction can be used to monitor the nodes of interest.

In the case of a CUT design that does not implement analog and mixed signal standard 1149.4, a structure similar to the standard can be implemented with an ABM including a single analog switch and a single boundary scan cell. Analog nodes that do not have a JTAG port can still be tested by adding JTAG ABMs and a standard TBIC to the nodes to be tested, allowing them to be directly controlled by the JTAG controller. The ATC can then send data to be loaded into the ABMs and the TBIC (or the OLTR), and does not need to send an instruction.

Additionally, on-chip memory can be reconfigured to function as data memory during testing.

The International Technology Roadmap for Semiconductors, 1999 edition, reports that analog and mixed signal (AMS) testing will focus on the use of JTAG and BIST due to system complexity and ATE limitations. While different AMS test methods have been proposed in literature or as product, embodiments disclosed herein provide a structural AMS DFT for almost any AMS system. Some embodiments can be configured to work off-line for manufacturing tests, or on-line for field tests and high safety system applications, without altering either the CUT or the testing circuitry design.

In view of the many possible embodiments to which the principles of my described embodiments may be applied, it should be recognized that the described embodiments are illustrative only and should not be taken as limiting the scope of my invention. Rather, I claim as my invention all such embodiments as may come within the scope of the following claims and equivalents thereto.

I claim:

1. An integrated circuit comprising testing circuitry and analog nodes of a circuit under test, the testing circuitry comprising:
    a program memory that stores data identifying at least a plurality of the analog nodes of the circuit under test and one or more tolerance values associated with the plurality of the analog nodes;
    noise calibration circuitry that combines one or more calibration values with the one or more tolerance values to produce one or more combined values;
    a condition checker that uses the one or more combined values to check the plurality of the analog nodes for fault states; and
    a main control unit coupled to the program memory, the noise calibration circuitry and the condition checker that synchronizes testing of the core logic circuitry.

2. The integrated circuit of claim 1 wherein the testing circuitry further comprises a tester interface.

3. The integrated circuit of claim 2 wherein the tester interface is a host computer interface.

4. The integrated circuit of claim 1 wherein the testing circuitry further comprises a second memory for storing diagnostic data.

5. The integrated circuit of claim 1 wherein the testing circuitry is JTAG-compliant.

6. The integrated circuit of claim 1 wherein the testing circuitry includes a JTAG controller module comprising:
    a JTAG controller module memory for storing data transmitted to the JTAG controller module;
    a JTAG controller module control unit; and
    a test access port controller.

7. The integrated circuit of claim 1 wherein the noise calibration circuitry comprises:
    a calibrate-in register that produces the one or more calibration values.

8. The integrated circuit of claim 1 wherein the testing circuitry further comprises a second condition checker.

9. The integrated circuit of claim 1 wherein the main control unit comprises:
    a program counter;
    a plurality of registers for storing addresses of the analog nodes; and
    a control unit for controlling the main control unit.

10. The integrated circuit of claim 9 wherein the integrated circuit further comprises a diagnostic data memory, and wherein the main control unit further comprises:
    a data pointer for addressing the diagnostic data memory to archive test results.

11. The integrated circuit of claim 9, wherein the testing circuitry comprises a plurality of condition checkers, and wherein the main control unit further comprises:
- a decoder and latch for selecting a condition checker from the plurality of condition checkers in the testing circuitry.

12. An integrated circuit comprising testing circuitry and analog nodes of a circuit under test, wherein the testing circuitry comprises:
- means for storing addresses of at least a plurality of the analog nodes along with one or more tolerance values associated with the plurality of the analog nodes;
- means for selecting an analog node of the circuit under test by selecting an address from the stored addresses of the plurality of the analog nodes;
- means for obtaining a test value from the selected analog node;
- means for retrieving a tolerance value of the one or more tolerance values, the retrieved tolerance value associated with the selected analog node;
- means for producing a calibration value to combine with the retrieved tolerance value; and
- means for checking whether the selected analog node is in a fault state based at least in part on the obtained test value, the retrieved tolerance value and the calibration value.

13. The integrated circuit of claim 12 wherein the means for checking comprises means for generating an error indication signal in response to the checking.

14. The integrated circuit of claim 12 further comprising:
- means for storing data identifying the selected analog node along with the test value from the selected analog node.

15. The integrated circuit of claim 12 further comprising means for communicating with a host computer.

16. The integrated circuit of claim 12 further comprising:
- means for selecting a condition checker for performing the checking.

17. In an integrated circuit comprising an analog test controller and analog nodes in a circuit under test, a method comprising:
- selecting an analog node from data identifying at least a plurality of the analog nodes in the circuit under test, wherein the data identifying the plurality of the analog nodes is stored in a memory of the analog test controller along with one or more tolerance values;
- obtaining a test value from the selected analog node;
- retrieving a tolerance value associated with the selected analog node from the one or more tolerance values stored in the memory;
- combining a calibration value with the retrieved tolerance value to produce a combined value; and
- checking the selected analog node for a fault state using the combined value.

18. One or more computer-readable media having stored thereon computer-executable instructions for performing the method of claim 17.

* * * * *